Nov. 3, 1964 W. F. BENNETT 3,155,551

DIFFUSION OF SEMICONDUCTOR BODIES

Filed Oct. 28, 1959 3 Sheets-Sheet 1

10

INVENTOR
W.F. BENNETT
By S. Gundersen
ATTORNEY

INVENTOR
W.F. BENNETT
BY S. Gundersen
ATTORNEY

Nov. 3, 1964 W. F. BENNETT 3,155,551

DIFFUSION OF SEMICONDUCTOR BODIES

Filed Oct. 28, 1959 3 Sheets-Sheet 3

INVENTOR
W.F. BENNETT

By S. Gandersen
ATTORNEY

United States Patent Office 3,155,551
Patented Nov. 3, 1964

3,155,551

DIFFUSION OF SEMICONDUCTOR BODIES

Wesley F. Bennett, Reading, Pa., assignor to Western Electric Company, Incorporated, New York, N.Y., a corporation of New York Filed Oct. 28, 1959, Ser. No. 849,413
5 Claims. (Cl. 148—191)

This invention relates to the fabrication of semiconductor devices and particularly to the fabrication of diffused semiconductor bodies having a reduced minority carrier concentration at the diffusion surface.

The diffusion of impurities into a semiconductor has been used in several variations to obtain differing impurity densities, distributions, and conductivity types. The present invention is primarily concerned with that type of diffusion called vapor-solid diffusion in which the impurity as a vapor is diffused directly into the semiconductor body without the prior formation of a solid surface layer of the diffusant. In one aspect, as will be shown, the invention may be used to control minority carrier density and distribution regardless of the manner in which the carriers were originally introduced into the body. Normally, the minority carrier concentration of such a semiconductor body is highest at the diffusion surface and decreases as a complementary error function into the body normal to the diffusion surface. When the device is a transistor with the emitter junction on or immediately below the diffusion surface, the high minority carrier surface concentration results in a low emitter junction breakdown voltage. For those uses where high reverse breakdown voltage is necessary, prior art techniques are able to provide a breakdown voltage of about 3 to 3½ volts. However, specialized applications in new fields require devices which can be efficiently produced with reverse breakdown voltages in the order of 10 volts.

The dimensional control of the junction, which is the major advantage of the straight diffusion process, has, as was indicated above, the attendant characteristic of maximum minority carrier concentration at the diffusion surface. The straight diffusion method consists of heating the semiconductor material in a nonreactive vacuum furnace to a temperature below the melting point of the semiconductor, and introducing the significant impurities in vapor form either as a gas flowing through the furnace or by evaporation from solid doping agents placed within the furnace. The ultimate parametric values of the transistor are determined by the temperature of the minority carrier source material which controls the impurity concentration at the diffusion surface, the temperature of the semiconductor body, and duration of its exposure to the doping vapor. The working temperature of the semiconductor body controls the rate of diffusion, and the length of exposure time controls the depth of diffusion and, therefore, the location of the junction.

The product of straight diffusion has the impurity distributed according to a true complementary error function curve for the particular impurity and semiconductor material involved if the concentration of impurity vapor at the diffusion surface satisfies the theoretical requirements of an infinite source. The slope and shape of the curve can be modified by varying the doping vapor concentration at the surface to change the sheet resistivity of the diffused zone and the depth to the junction. A refinement of this technique utilizes two or more doping gases, the diffusants having different diffusion constants which cause a distribution differential. Whatever the concentration of the gaseous diffusant or number of diffusants used in this straight diffusion method, that portion of the semiconductor body immediately adjacent the diffusion surface has the highest concentration of minority carriers and this concentration diminishes with depth. It will be understood, of course, when plural diffusants are used that the electrical characteristics will depend upon the algebraic sum of their concentrations with holes and electrons accorded opposite signs. In the event that the product of this diffusion is to be used as a transistor, it is usually the practice to produce an emitter junction at the diffused surface by alloying with a solid material. Inevitably, a low emitter breakdown voltage results. The breakdown voltages in devices of this type are generally in the order of one volt for germanium transistors utilizing antimony as significant impurity.

A known technique, termed limited source diffusion, an improvement of the straight diffusion described above, tends to raise the breakdown voltage. This method involves removal of the minority carrier source after a given time so that the available doping vapor is depleted. The semiconductor body continues to be exposed to heat so that diffusion of the doping agent already distributed in the body continues. The consequence of the continued heating is the "out-diffusion" of a portion of the doping material diffused in the surface area of the body and a redistribution of the remaining impurity causing a relocation of the junction. This method, while it improves the breakdown voltages, nevertheless does not produce devices having the parameters demanded by the more recent circuit technology. Contrasting a germanium transistor having antimony as a significant impurity produced by limited source diffusion with a similar device produced by the straight diffusion process discussed above, the product of the limited source diffusion is found to have an improved breakdown voltage which does not in general exceed three volts. This improvement is limited to devices having resistivities in the diffused zone in the order of 100 to 150 ohms per square, as a lack of control and poor reproducibility accompany the attempt to extend the method to greater resistivities.

Investigation of the limited source diffusion process utilizing either a vacuum or a carrier gas led to the conclusion that increasing the breakdown voltage to a sufficiently high degree was not practicable with any of the above methods. In retrospect, with the method and product of the present invention at hand, the reasons for this inadequacy are understood. The doping vapor in the system can pass through the tube without diffusing into the semiconductor body and it can contact and condense on the surface of the furnace at any location. Those impurity atoms which impinge on the wall of the furnace upstream of the semiconductor location have a strong chance, if an atom breaks loose from the wall during the diffusion phase, to deposit on the semiconductor. Under these circumstances, the walls of the furnace become a secondary source of diffusant material which affects the concentration of the diffusion vapor at the semiconductor surface with the loss of control of minor carrier concentration.

In a vacuum diffusion process the secondary radiation impurity material poses a special problem. Since induction heating is the only practical method of heating the body in a vacuum, the surface of the furnace is usually at a much lower temperature than the semiconductor piece being worked, and, indeed, has a variable and uncertain temperature. This results in condensation in different degrees on different portions of the furnace surface which presents an unpredictable concentration of impurity atoms at the diffusion surface and interferes with control. In the limited source diffusion method whether practiced in a vacuum or a carrier gas, the secondary radiation interferes with the out-diffusion of impurities limiting the maximum effect achievable and upsetting control of the process.

It is an object of the present invention to provide new techniques for preparing a semiconductor body surface with a reduced minority carrier concentration adjacent the diffusion surface.

Another object of this invention is to facilitate the practical control of production of P–N junctions in semiconductor bodies.

Another object of the invention is to increase the degree of control of the breakdown voltage and the diffused zone resistivity of semiconductor material.

A further object of the invention is to provide a practical method for quantity production of diffused semiconductor bodies.

Yet another object of the invention is to provide a semiconductor body having a high emitter breakdown voltage which is reproducible in quantity by an economical method.

Accordingly, the invention in one aspect is manifested in a method of making a junction in a semiconductor body. A semiconductor material of one conductive type is heated to a temperature below its melting point in a stream of reducing or inert gas free of impurities. A significant impurity of an appropriate type is introduced into the gas at an upstream position relative to the material and the semi-conductor material is exposed to the doped stream of gas for the given time and temperature required to diffuse the doping vapor to prescribed depth and concentration in the material, thus forming the required junction. The doping material is removed or cooled to reduce its vapor pressure, thus reducing the available minority carriers being introduced into the gas stream. The material is cooled in the nearly dope-free gas stream. The wafer is then transferred to another stream of gas essentially free of traces of significant impurities. The risk of secondary radiation of impurities is thus avoided. The material is heated for a prescribed time and temperature to out-diffuse a portion of the significant impurity from the material and to redistribute the minority carriers remaining in the material to obtain the required junction depth and minority carrier concentration distribution. The material is then cooled in the gas stream, whereupon it is ready for further fabrication.

Another aspect of the invention is the redistribution of minority carriers already present in a semiconductor body. For example, the body may be a crystal grown from a molten phase in which doping material has been added to establish a junction at a given location. The doped material is heated in an impurity-free stream of reducing gas, and the contained impurity is partially out-diffused and partially redistributed with an accompanying relocation of the junction.

Another feature of the invention is an improved semiconductor body unique in minority carrier concentration in the diffused zone which is produced according to the methods described above.

This invention will be more clearly and fully understood from the exemplary embodiments when read with reference to the accompanying drawings in which.

Figure 1:
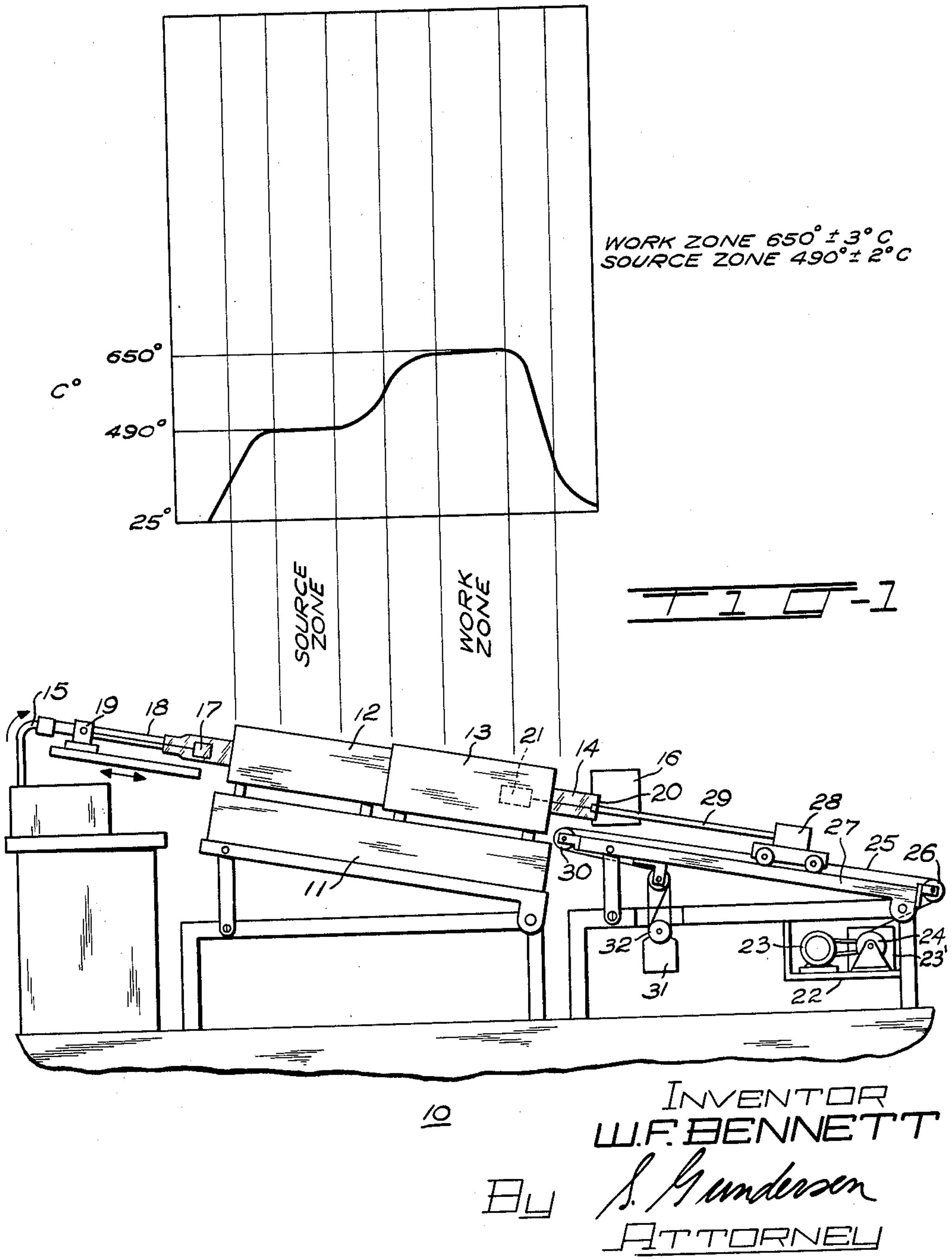
FIG. 1 is a mechanical schematic view of a furnace suitable for use in one stage of the process according to one feature of the invention including a graph of the thermal-profile of the furnace.

It will be realized from the detailed description which follows that the invention in one aspect may appropriately be termed a two-stage or two-tube diffusion process and apparatus. FIG. 1 shows the first of the so-called "tubes" or furnaces and, since it contains all of the elements necessary for the second tube, will also serve to illustrate the second stage of the invention. As pictured in FIG. 1, the first stage, shown generally as 10, consists of a furnace 11, having two sections 12 and 13 mounted in tandem. Thermocouple-controlled electric heating elements (not shown) are suitably placed so that the desired thermal profile is maintained. FIG. 1 also shows in graphic form the thermal profile to be maintained in the first stage of the process when an antimony impurity is diffused into a P-type germanium semiconductor body. Vertical lines extending between the furnace schematic and the graph related positions in the furnace and their associated temperature as represented on the graph. It will be noted that the temperature rises from 25 degrees centigrade just outside the lefthand side of section 12 to 490 degrees centigrade at the central, or source zone, portion of section 12. This central portion of section 12 is the location of the solid antimony source during the vaporization stage for supplying the impurity vapor. The temperature then rises in the transistion zone existing between sections 12 and 13 increasing to 650 degrees centigrade in the work zone, section 13. This temperature is maintained over the diffusion area of the furnace. A wide range of temperatures, e.g. 350° C. to 590° C. is available for inducing evaporation of the antimony, and selection of an appropriate value is dependent primarily on the concentration density desired and the method of heating the source and distributing the vapor. However, there is an upper limit to the diffusion temperature for P-type germanium. That limit, the conversion temperature at which P-type germanium is converted to N-type, is about 675 to 680 degrees centigrade. A zone 14 is provided at the righthand end of section 13 in which a gradual reduction of temperature to 90 degrees centigrade occurs which provides a cooling zone upon withdrawal of the semiconductive wafer at the end of the first stage.

Gas input tubing 15 provides at different times hydrogen carrier gas and nitrogen purging gas which flow from left to right through tubing 18 and furnace sections, 12, 13 and 14. The gases, as well as unused antimony vapor, are removed at the exhaust hood 16. The hydrogen gas is burned off at the exit end of section 14 by means of a suitable burner (not shown) maintained with an external fuel gas.

A source of antimony is positioned in a small cup 17. The cup 17 is sealed in the furnace entry tubing 18 and may be moved into and out of section 12 by means of external magnet 19 cooperating with a magnetic member attached to the cup. This magnetic control arrangement permits a system of movement of the impurity source into and out of furnace section 12 without the trouble of packing glands and sliding joints, a particular advantage in a system utilizing hydrogen as a carrier gas. Element 20 functions to permit a boat 21 which holds the semiconductor bodies to be moved through the hydrogen burn-off flame into and out of section 13. A variable speed drive shown generally at 22 is positioned to control the movement of carriage 28 and work boat 21 into and out of the furnace. The work boat drive arrangement consists of a constant speed reversible motor 23 directly connected to a variable speed drive 23' then to a gear reduction box upon whose output shaft is mounted a small capstan. By adjusting the variable drive, an infinite number of speeds may be obtained within its range. Further variations of drive speed are easily achievable by changing either the gear box or the diameter of the capstan. A cable 25 is wound around the capstan 24 then over a pulley 26 at the end of a track held on supporting frame 27. The carriage 28 rides on the track and supports a pushrod 29 which holds the member 20. Cable 25 passes through carriage 28 to a second pulley 30 to return it under the track support 27 where a simple weight 31 is fastened at the end of the cable with a pulley sheeve 32.

In operation, the capstan 24 raises and lowers the weight 31 and the cable 25 moves the carriage 28 up and down the track. The carriage is attached to the cable with a quick-release clamp (not shown). While other drive systems may be used to perform the function of the invention, an advantage of this arrangement is that positive drive is obtained only in the extract direction of the work boat. When the semiconductor body is moved into furnace section 13, the only force moving the carriage 28 up the track is that generated by the weight 31. The weight 31 removes all free play and backlash from the gear system. Also, if, for some reason, the work boat were to bind in the hydrogen burn-off flame at the entrance of the furnace tube 14 or within the furnace tube 13, only the small force generated by the weight would be applied to the boat. The capstan 24 would simply unwind without risk that a greatly increased force might fling out the contents of the work boat, damage the furnace or furnace muffle.

The second stage of the two-stage diffusion process utilizes a diffusion furnace similar in structure to that described in FIG. 1. Since the second stage accomplishes out-diffusion in a hydrogen stream essentially free of impurity vapor, it is evident that the impurity vaporizing section 12 is unnecessary in the second stage. Also, of course, the impurity source 17 and magnetic control 19 are not necessary in the second stage and may be eliminated from the furnace arrangement. In the second stage, heating control is provided for maintaining the appropriate thermal profile in the diffusion furnace and the cooling sections. The same thermal profile is used for convenience. However, any profile may exist in the unused source area of second stage providing it does not affect the profile of the work area. If identical profiles are used in the furnaces for both stages, the furnaces may be used interchangeably with an appropriate replacement of the first stage furnace muffle with an antimony-free second stage muffle.

With this structure in mind, we will proceed to describe a specific embodiment of this invention which consists of a method of preparing a junction in a semiconductor body by diffusion and out-diffusion in a hydrogen environment. It will be assumed that a proper flow of hydrogen for the process has been established through the apparatus of FIG. 1 entering via gas line 15, passing through tube 18 and furnace sections 12 and 13, and finally being exhausted or burned under hood 16. The first step is a diffusion step in which the semiconductive wafer boat 21 is extracted from the furnace and the P-type germanium starting material which may be in the form of work slices and control bars are loaded on to it. The work boat may be removed from the furnace by withdrawal through the burn-off flame maintained at the righthand end of section 14. The drive motor 23 is set at a speed of about twenty-four inches per minute, and the work boat 21 is inserted into section 14 by movement of carriage 28 to the left, transmitting its motion to member 20 which in turn is attached to work boat 21. The drive speed is then changed to one-half inch per minute. The work remains in section 14 for approximately 15 minutes. The work boat is then driven from section 14 to 13 with a travel time of approximately 18 minutes. The work boat is maintained in the working area of section 13 for a period of about fifteen minutes permitting the work and the boat to come up to a diffusing temperature of 650 degrees centigrade. At the end of this period, the antimony source 17 is moved into section 12 and is maintained there at a temperature of 490 degrees centigrade for the diffusion period. The time of the diffusion period is approximately from 10 to 60 minutes. For this entire time, the antimony is radiating antimony atoms into the hydrogen carrier gas which carries them from section 12 into section 13 where a portion of these atoms land on the work contained in work boat 21 and diffuse into the semiconductor bodies. As has been previously stated, the location of the resulting P–N junction as well as the concentration of the minority carriers in the diffused portion is controlled by the length of diffusion and the impurity source and semiconductor body temperatures.

At the end of the diffusion cycle, the antimony source is pulled back from section 12 into tube 18. The drive motor 23 is set at an extremely slow speed, approximately one-half inch per minute, and the work is programmed from the working portion of section 13 to the end tubing 14. The work boat containing the semiconductor bodies will arrive at the center portion of section 14 eighteen minutes after it has left the working portion of section 13. During this time the work pieces have experienced a reduction in temperature from 650 degrees centigrade to 25 degrees centigrade in accordance with the thermal profile shown in the graph of FIG. 1 while the hydrogen stream, relatively free of antimony impurities, has been passing over and around it. An additional cooling time in the hydrogen stream of about twelve minutes is allowed. This slow cooling maintains the lifetime of the carriers in the germanium and prevents any oxidation by a back-flow of air through the hydrogen burn-off flame into section 14.

Figure 3:
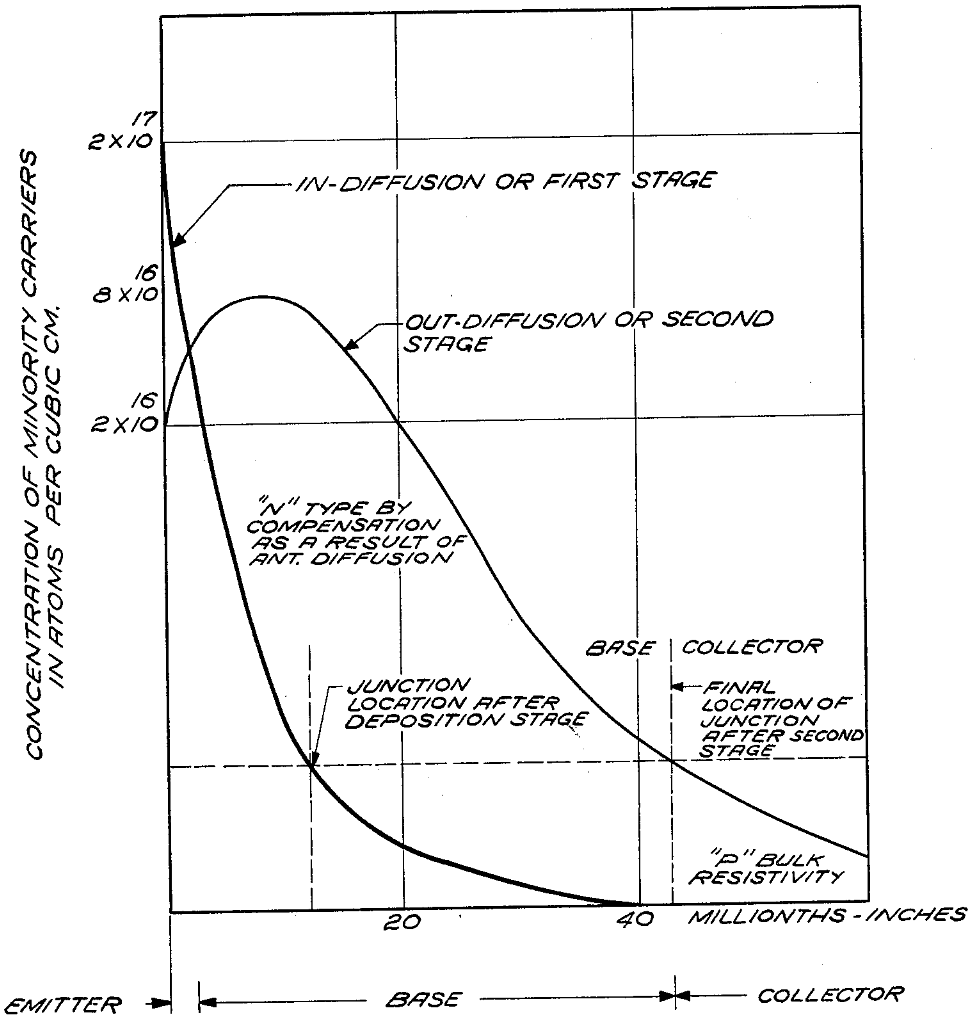
FIG. 3 is a graphic representation of the carrier concentration of a semiconductor body after the first and second stages of the inventive method.

FIG. 3 illustrates the concentrations of minority carriers at different depths in the wafer at the end of the first, or diffusion (deposition), stage and also at the end of the second, or out-diffusion, stage. The ordinate of the graph shows concentration of minority carriers in atoms per cubic centimeter and the abscissa measures depth into the wafer normal to the diffusion surface. At the end of the first stage the curve is that of a straight diffusion process for the particular materials involved and is of the error function type. A junction has been formed which is located approximately 17 millionths of an inch from the diffusion surface. The concentration of minority carriers is seen to increase sharply towards the surface where it is approximately $2\times10^{17}$ atoms per cubic centimeter. Such a high surface density of minority carriers would result in a very low breakdown voltage if the body were used as a transistor in the form it is in at the end of this stage.

After cooling the wafer, the product of the first stage becomes the input of the second stage. The second stage consists of a furnace similar to that shown in FIG. 1 which also has an environmental gas source providing hydrogen during the out-diffusion stage and nitrogen as a purging gas through entry piping 15. Since it is a requirement in the second stage that no antimony be present, there is no necessity for providing the impurity source boat 17, the tube 18, or the magnetic coupling 19. Furthermore, there is no necessity for the impurity vaporizing section 12. It has been found that removal from the first in-diffusion furnace to the furnace of the second stage is essential to eliminate entirely the effects of secondary radiation previously discussed. For the same reason it is necessary to provide a new work boat 21. It is to be understood that the entire structure of the second stage is to be essentially free of contaminants of every type. The work is loaded on the work boat and transferred into equivalent section 13 of the second furnace with the same delay at 14 as in the first stage. During the time the work is at out-diffusion temperature some antimony is out-diffused from the wafer drastically changing the minority carrier density in the diffused zone. The P–N junction is shifted further into the wafer and the surface minority carrier concentration is drastically reduced. The out-diffusion process is approximately 100 to 400 minutes. The work is slowly cooled as in the deposition phase.

The end product of the second stage is better understood as being of unique configuration by referral to FIG. 3. It is seen that the junction has been shifted about 25 millionths of an inch further into the wafer. The surface concentration of minority carriers is now $2\times10^{16}$ atoms per cubic centimeter, smaller than the maximum concentration which appears at a depth of about 15 millionths of an inch. The shape of the curve is no longer that of an error function. The sharp reduction in minority carrier concentration at the surface provides high emitter breakdown in the range of 10 volts when an emitter junction is alloyed to the diffusion surface to the depth shown in FIG. 3. With the secondary radiation of impurity removed in the out-diffusion stage, the tight tolerances typical of straight diffusion are extended and the location of the junction as well as the character of the concentration curve can be closely controlled.

Figure 2:
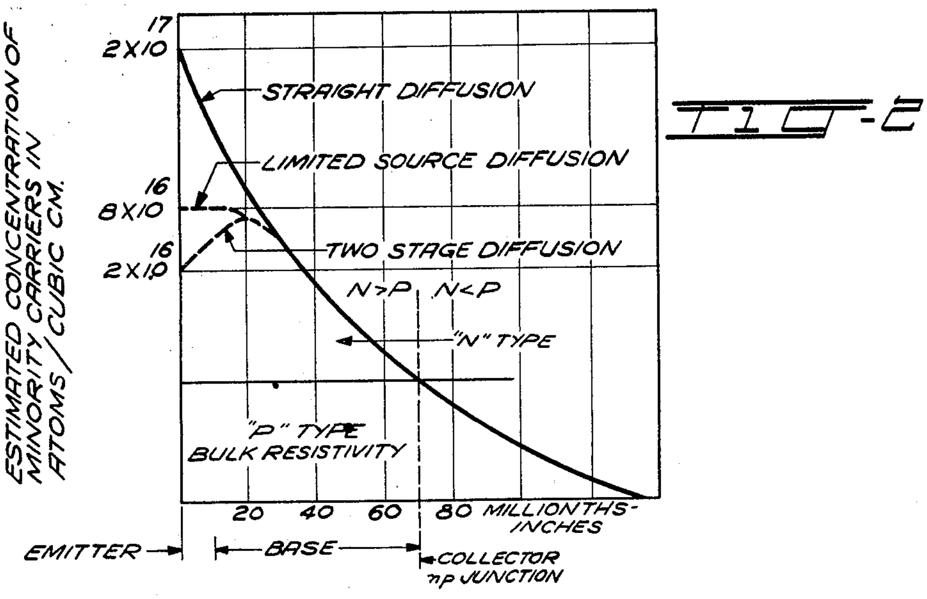
FIG. 2 is a graphic representation of minority carrier concentration in junction bodies produced by straight diffusion, limited source diffusion, and the method of the present invention with the junction of each located the same distance from the diffusion surface.

FIG. 2 shows more or less qualitatively a comparison of transistors produced by each of the three diffusion methods, that is, straight diffusion, limited source diffusion, and the two-stage diffusion method of the present invention. The location of the P–N junctions in each of the devices has been taken to be the same depth from each of the diffusion surfaces. At the surface where the emitter junction is to be formed, the product of the two-stage diffusion has a minority concentration of about one-fourth that of limited source diffusion and about one-tenth that of straight diffusion. While the three curves are shown as coinciding in the N region immediately preceding the junction, this may not be a precise representation of the case. As was previously stated, the pure error function curve is modified in depth by out-diffusion as well as in limited source diffusion. With out-diffusions of long duration it is believed that this portion of the curve would not coincide with the simple error function curve.

To insure the safe and effective practice of the two-stage method, a fail-safe system has been devised which insures the safe use of the explosive reducing gas on large scale production runs and minimizes contamination problems by providing for purging with an inert gas which contributes a non-explosive environment when dangerous conditions arise. The system envisages a source of explosive reducing gas, usually hydrogen, and two sources of inert purging gas, usually nitrogen. The first nitrogen source may be considered a general or house nitrogen supply and the second nitrogen source and an emergency auxiliary bottle supply.

It is to be understood that the above described arrangements and methods are simply illustrative of the principles of the invention. One versed in the diffusion art will realize that the two-stage diffusion process may be adapted, for example, to other semiconductor and doping materials. Inevitably, such use of the method will require times and temperatures specifically tailored to result in a desired device. Those skilled in the art may devise numerous other arrangements embodying the principles of the invention and falling within its spirit and scope.

What is claimed is:

1. The process of making a junction semiconductor body which comprises the steps of placing a semiconductor wafer of a first conductivity type in a first chamber, heating the wafer to a temperature below its melting point in a first stream exclusively of flowing non-oxidizing gas, introducing doping vapor of a significant impurity of the opposite conductivity into the gas at an upstream position relative to the wafer, exposing a face of the wafer to the doped stream for a given time to diffuse the doping vapor to form a junction therein, ceasing to introduce the doping vapor into the non-oxidizing gas stream, cooling the wafer, transferring the wafer to a second chamber substantially free of traces of said significant impurity, heating and wafer for a prescribed time and temperature in a second stream of non-oxidizing gas to produce out-diffusion of said significant impurity from the wafer into the gas stream and a substantial reduction of the significant impurity concentration in the vicinity of said wafer face, and cooling the wafer.

2. Method according to claim 1 which the non-oxiding gas is hydrogen.

3. Method according to claim 1 in which the semiconductor wafer is P-type germanium and the significant impurity is antimony.

4. Method according to claim 1 in which the non-oxidizing gas is hydrogen, the semiconductor wafer is P-type germanium, the significant impurity is antimony which is heated in the range of 350 to 590 degrees centigrade to produce the doping vapor, the wafer is exposed to the impurity vapor at a temperature of up to 670 degrees centigrade for from 10 to 60 minutes, and the wafer is out-diffused in the impurity-free second hydrogen stream at a temperature of up to 670 degrees centigrade for from 100 to 400 minutes.

5. In the fabrication of a junction type semi-conductor body having an emitter junction breakdown voltage in the order of ten volts, the steps which comprise heating a wafer of P-type germanium to a diffusing temperature of approximately 650° C. in a flowing gas stream consisting of hydrogen, introducing into the hydrogen stream at an upstream position relative to the wafer a doping vapor consisting of antimony evaporated at a temperature of approximately 490° C., exposing a face of the wafer to the doped stream for from 10 to 60 minutes thereby diffusing the antimony through said face and into the wafer to form a collector junction therein, ceasing to introduce the antimony into the hydrogen stream, slowly cooling the wafer in the antimony free hydrogen stream, transferring the wafer to a second hydrogen stream substantially free of any antimony, heating the wafer for from 100 to 400 minutes at a temperature of approximately 650° C. thereby causing out-diffusion of antimony from the wafer into the hydrogen stream and a substantial reduction in the antimony concentration in the vicinity of said wafer face and slowly cooling the wafer in the hydrogen steam.

References Cited in the file of this patent

UNITED STATES PATENTS

| | | |
|---|---|---|
| 2,692,839 | Christensen | Oct. 26, 1954 |
| 2,784,121 | Fuller | Mar. 5, 1957 |
| 2,810,870 | Hunter et al. | Oct. 2, 1957 |
| 2,815,303 | Smith | Dec. 3, 1957 |
| 2,817,351 | Kling | Dec. 24, 1957 |
| 2,819,990 | Fuller | Jan. 14, 1958 |
| 2,827,403 | Hall et al. | Mar. 18, 1958 |
| 2,849,014 | Pressler | Aug. 26, 1958 |
| 2,870,049 | Mueller et al. | Jan. 20, 1959 |
| 2,898,247 | Hunter | Aug. 4, 1959 |
| 2,953,486 | Atalla | Sept. 20, 1960 |

OTHER REFERENCES

Glasstone: "Thermodynamics for Chemists," D. Van Nostrand Co., Inc., New York, March 1958, pages 235–237.

Journal of Applied Physics, vol. 26, 1955, pages 1520–1521.